United States Patent [19]

Matsuyama et al.

[11] Patent Number: 4,615,299

[45] Date of Patent: Oct. 7, 1986

[54] PLASMA CVD APPARATUS FOR MAKING PHOTORECEPTOR DRUM

[75] Inventors: Toshiro Matsuyama; Takashi Hayakawa, both of Tenri; Yoshimi Kojima, Nara; Shiro Narikawa, Kashihara; Shaw Ehara, Nara, all of Japan

[73] Assignee: Sharp Kabushiki Kaisha, Osaka, Japan

[21] Appl. No.: 709,185

[22] Filed: Mar. 7, 1985

[30] Foreign Application Priority Data

Mar. 13, 1984 [JP] Japan .................................. 59-48368

[51] Int. Cl.$^4$ ............................................. C23C 13/08
[52] U.S. Cl. ..................... 118/723; 118/730; 118/50.1
[58] Field of Search ............... 118/723, 730, 50.1, 118/729; 427/38; 313/231.31

[56] References Cited

U.S. PATENT DOCUMENTS 4,466,380 8/1984 Jansen et al. .................. 118/712
4,480,010 10/1984 Sasanuma et al. ............. 428/457

Primary Examiner—Norman Morgenstern
Assistant Examiner—K. Jaconetty
Attorney, Agent, or Firm—Birch, Stewart, Kolasch, & Birch

[57] ABSTRACT

A plasma CVD (chemical vapor deposition) apparatus of the capacitance coupling type for effecting the chemical vapor deposition on a drum which includes an air tight chamber made of an electrically conductive material, a support provided in the chamber for supporting the drum inside the chamber in an electrically insulated relationship with the chamber, and an RF power source for supplying RF power to the drum. The chamber is grounded and, therefore, the plasma is generated between the drum and inside wall of the chamber. The apparatus is provided with means for providing a smooth surface on the drum. The drum can be used as a photoreceptor for use in an electrophotographic copying machine.

4 Claims, 7 Drawing Figures

PLASMA CVD APPARATUS FOR MAKING PHOTORECEPTOR DRUM

BACKGROUND OF THE INVENTION

1. Field of the Invention

The present invention relates to a plasma CVD (chemical vapor deposition) apparatus of the capacitance coupling type. More particularly, it relates to an apparatus for making a photoreceptor member used in an electrophotographic copying machine.

2. Description of the Prior Art

The forming of a photosensitive layer of amorphous silicone on a plate or drum is generally done by the decomposition of monosilane ($SiH_4$) gas or disilane ($Si_2H_6$) gas through a plasma CVD method. In the plasma CVD method it is necessary to supply a high frequency (RF) power for the generation of plasma, and such a supply is done by a capacitance coupling or inductance coupling. From the viewpoint of mass production of the photoreceptor member, it has been considered that it is appropriate to use the capacitance coupling rather than inductance coupling.

The plasma CVD apparatus of capacitance coupling type according to the prior art is shown in FIGS. 1 and 2, which is designed for depositing a photosensitive layer on a surface of a drum 1 thereby making a photoreceptor drum for use in an electrophotographic copying machine. The apparatus shown includes a cylindrical chamber 3 made of metal and a cylindrical electrode 2 provided in chamber 3. Suitable pipes P1 and P2 are connected to the chamber so as to evacuate the chamber and also to supply a suitable amount of monosilane or disilane gas.

Electrode 2 is connected to an RF power supply 6 through a suitable matching unit 5 of capacitive type. A matching unit is disclosed, for example, in "Experimental and design information for calculating impedance matching networks for use in RF sputtering and plasma chemistry" presented in "Vacuum" volume 29, number 10.

When the RF power is supplied, the plasma extends not only between electrode 2 and drum 1, but also between electrode 2 and the inside wall of chamber 3.

An improvement is shown in FIG. 3 in which a cylindrical shield plate 4 is provided around electrode 2 with a spacing of about several millimeters between electrode 2 and plate 4. The electric potential of plate 4 is made the same as that of chamber 3 and, therefore, no plasma will be produced between electrode 2 and the inner wall of chamber 3.

In the plasma CVD apparatus, the chamber is evacuated to a certain degree, and a certain amount of reaction gas is introduced into the chamber. Therefore, the volume of the chamber is a very important factor for determining the amount of gas necessary for the reaction process. In any one of the above described apparatus, however, electrode 2 is provided independently inside chamber 3 and, therefore, the chamber volume is much greater than that is necessary to generate plasma. Thus, more than necessary reaction gas is supplied to the chamber. Also, the size of chamber 3 is bulky.

To eliminate the above described disadvantages, an attempt has been made to remove electrode 2 and shield 4, and instead to provide an electrode on the inside wall of chamber 3. In other words, the chamber itself is supplied with the RF power. However, this introduces a further problem to be solved, such that chamber 3 must be electrically isolated. To this end, it is necessary to electrically insulate chamber 3, and also to provide a suitable insulating means in each pipes P1 and P2 so as to accomplish the complete isolation of the chamber which is supplied with RF power. Furthermore, from a safety viewpoint, it is necessary to provide a suitable isolation means so as to prevent any workers from having access to the chamber while it is operating.

SUMMARY OF THE INVENTION

The present invention has been developed with a view to substantially solving the above described disadvantages and has for its essential object to provide an improved plasma CVD apparatus of capacitance coupling type, which is compact in size.

In accomplishing these and other objects, an improved plasma CVD apparatus of capacitance coupling type for effecting the chemical vapor deposition on a drum, according to the present invention, comprises an air tight chamber made of an electrically conductive material, a support provided in the chamber for supporting the drum inside the chamber in an electrically insulated relationship with the chamber, and an RF power source for supplying RF power to the drum. The chamber is grounded and, therefore, the plasma is generated between the drum and inside wall of the chamber.

BRIEF DESCRIPTION OF THE DRAWINGS

These and other objects and features of the present invention will become apparent from the following description taken in conjunction with a preferred embodiment thereof with reference to the accompanying drawings, throughout which like parts are designated by like reference numerals, and in which.

DESCRIPTION OF THE PREFERRED EMBODIMENTS

Figure 1:
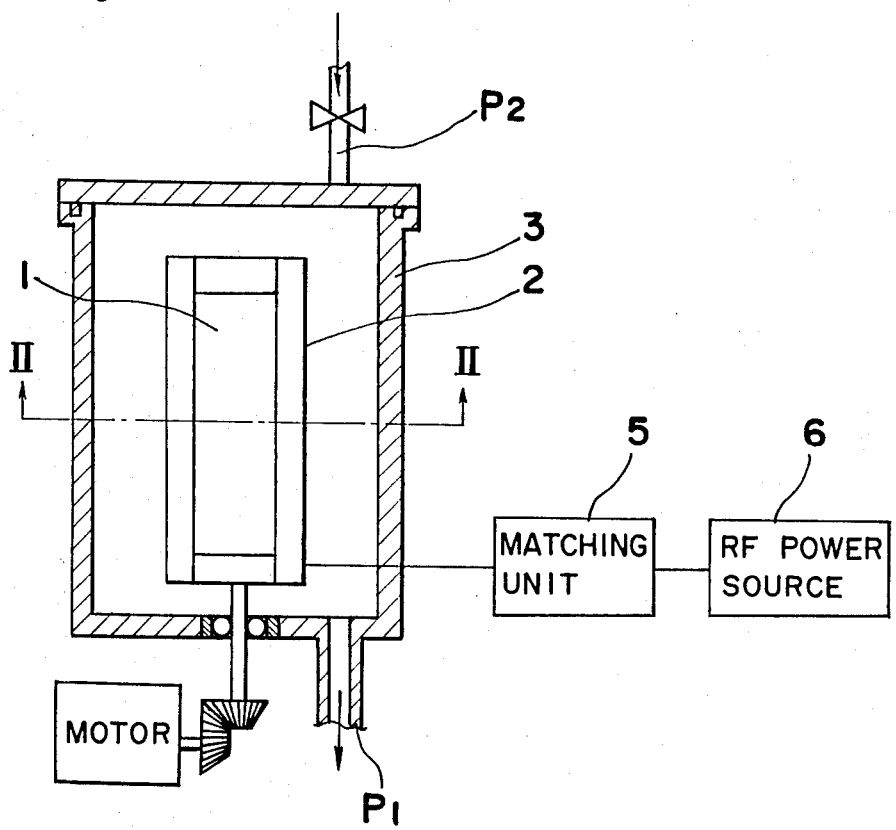
FIG. 1 is a side elevational view, partly removed, of a prior art plasma CVD apparatus.
Figure 2:
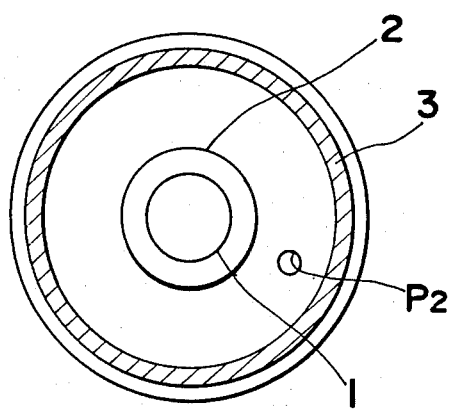
FIG. 2 is a cross-sectional view taken along line II—II shown in FIG. 1.
Figure 3:
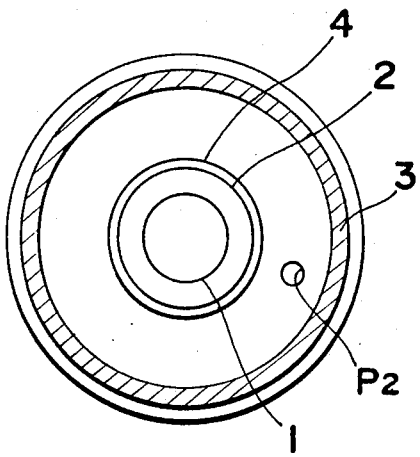
FIG. 3 is a view similar to FIG. 2, but particularly showing a modification according to another prior art plasma CVD apparatus.
Figure 4:
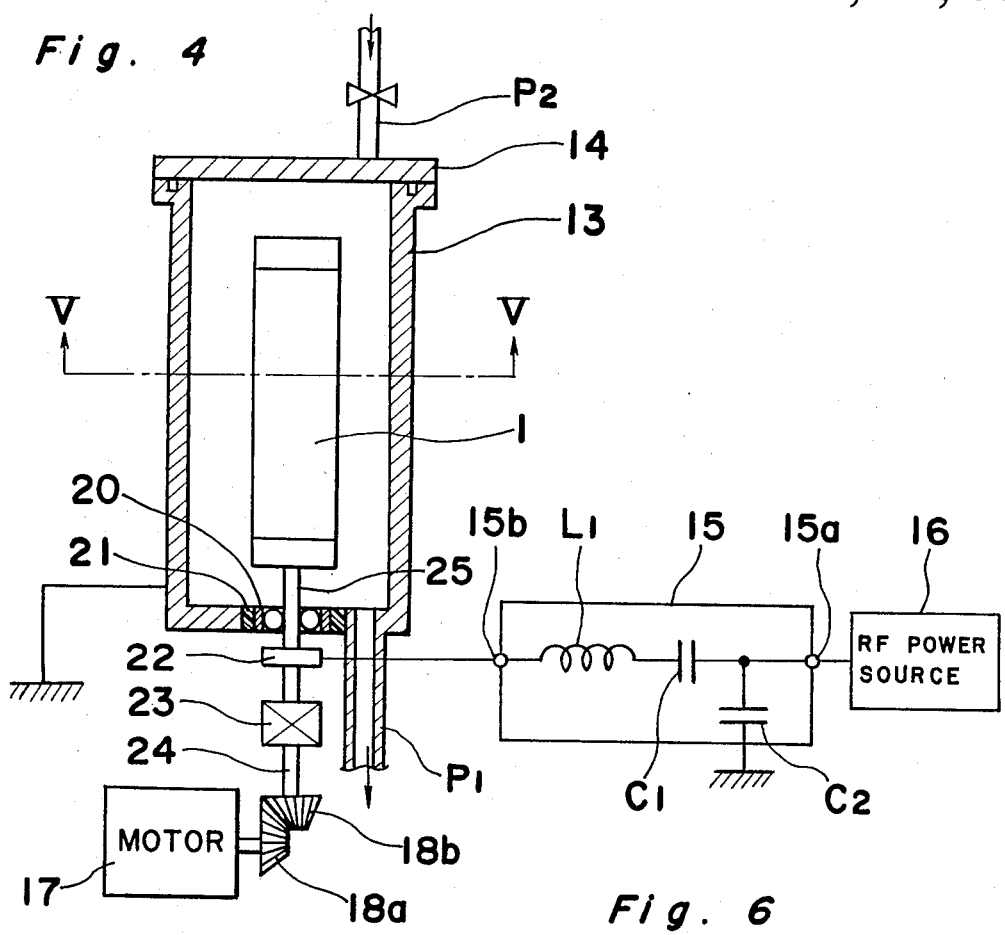
FIG. 4 is a side elevation view, partly removed, of a plasma CVD apparatus according to the present invention.
Figure 5:
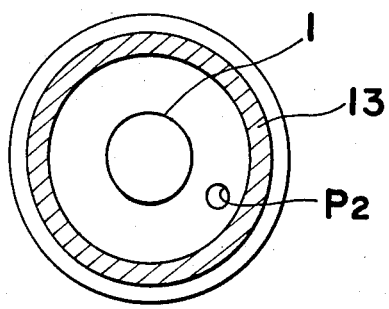
FIG. 5 is a cross-sectional view taken along line V—V shown in FIG. 5.

Referring to FIGS. 4 and 5, a plasma CVD (chemical vapor deposition) apparatus of capacitance coupling type according to the present invention comprises a cylindrical chamber 13 made of an electrically conductive material, such as metal. Chamber 13 is connected to ground. When viewed in FIG. 4, the upper end of chamber 13 is air tight sealed by a top lid 14 which can be removed to insert and take out a drum 1 from chamber 13. A pipe P2 extends from lid 14 for supplying reaction gas into the chamber 13. The lower end of chamber 13 is provided with a bottom wall which has a pipe P1 for evacuating the chamber and a center opening for mounting a bearing 20 and an electric insulation member 21 around bearing 20. Thus, bearing 20 is electrically insulated from chamber 13. A shaft 25 made of an electrically conductive material is rotatably inserted in bearing 20.

It is to be noted that the air tight sealing is effected by bearing 20 and its associated parts to permit the complete evacuation of chamber 13.

The upper end of shaft 25 extends inside chamber 13 so as to fixedly support drum 1, and the lower end thereof extends outwardly from chamber 13 and is connected to a joint 23, which is in turn connected through a shaft 24 and gears 18a and 18b to motor 17. Joint 23 is provided for electrically insulating shafts 25 from 24.

An intermediate portion of shaft 25 is mounted with a collector ring (slip ring) 22 for the electric connection between shaft 25 and matching unit 15. Matching unit 15 has an input 15a which is connected to the RF power source 16 and output 15b which is connected to the collector ring 22. A series connection of capacitor C1 and coil L1 is connected between input 15a and output 15b, and input 15a is connected to ground through capacitor C2, thereby defining a tank circuit. Accordingly, drum 1 is connected to the RF power source 16 by the capacitance coupling such that the impedance of the RF power source matches the impedance of the plasma discharge circuit defined between drum 1 and chamber 13. Also, the capacitor C1 is provided for adjusting the resonant frequency.

In operation, chamber 13 is evacuated by pipe P1 and is supplied with reaction gas through pipe P2. Then, RF power is supplied from source 16 through matching unit 15, collector ring 22 and shaft 25 to drum 1. Thus, the electric potential of drum 1 is very high when compared with the ground potential at the chamber wall. Thus, a high frequency electric field is produced between drum 1 and chamber 13, resulting in an ionization of the reaction gas and generation of plasma, effecting the plasma CVD.

According to the plasma CVD apparatus described above, since the cylindrical electrode member is eliminated, the size of the chamber can be reduced. Furthermore, by the above described arrangement such that the chamber is grounded, it is not necessary to electrically isolate the chamber 13. Therefore, the problems related to the isolation of the chamber will not be brought about.

Figure 6:
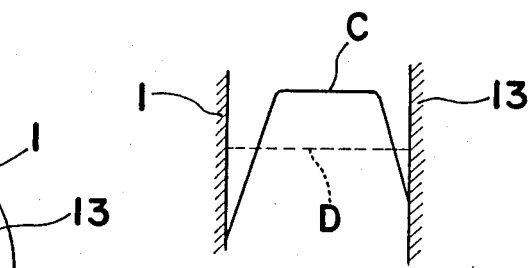
FIG. 6 is a graph showing a distribution of electric potential between a drum and a chamber.

Referring to FIG. 6 a distribution of electric field between drum 1 and chamber 13 is shown. Since drum 1 is connected to the RF power source through capacitor C1, drum 1 is electrically insulated from the viewpoint of DC current. When the plasma is generated, the electrons and positive ions in the space between drum 1 and the chamber wall 13 are alternately sent to drum 1 after each half cycle of RF power. However, since the mass of a positive ion is much greater than that of an electron, the mobility of the positive ion is much smaller than that of the electron. Therefore, the positive ions tend to stay in the space between drum 1 and chamber wall 13, and the electrons tend to be accumulated on drum 1 and in the capacitor C1. Thus, when the flow of positive ions and electrons into drum 1 and capacitor C1 balances in their number, the distribution of electric potential between drum 1 and chamber 13 can be represented by a curve C shown in FIG. 6, wherein a dotted line D shows a zero level. Since the gradient of electric potential near the drum surface is very steep, drum 1 attracts the positive ions with a great strength. Thus, under the condition for forming the amorphous silicone layer, the positive ions hit against the drum surface with a high impact, thereby adversely affecting the amorphous silicone layer.

Figure 7:
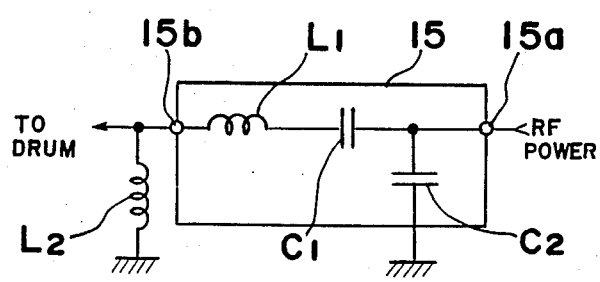
FIG. 7 is a circuit diagram showing a matching unit.

To improve this, a coil L2, as shown in FIG. 7, is connected between output 15b of matching unit 15 and the ground. When this is done, the electrons accumulated on drum 1 and in the capacitor C1 can be transmitted through coil L2 to ground. Accordingly, the gradient of electric potential near the drum surface can be made more moderate than discussed above, thereby preventing the positive ions from hitting the drum surface with a strong impact. Thus, the amorphous silicone layer formed on the drum surface can be made very smooth. It is to be noted that the inductance of coil L2 should be selected to be very high so as not to influence the matching condition of matching unit 15.

Although the present invention has been fully described with reference to a preferred embodiment, many modifications and variations thereof will now be apparent to those skilled in the art, and the scope of the present invention is therefore to be limited not by the details of the preferred embodiment described above, but only by the terms of the appended claims.

What is claimed is:

1. A plasma CVD (chemical vapor deposition) apparatus of the capacitance coupling type defining a plasma discharge circuit for effecting the chemical vapor deposition on a drum surface for making a photoreceptor for use in an electrophotographic copying machine, said plasma CVD apparatus comprising:

an air tight chamber made of electrically conductive material and connected to ground;

a support provided in said chamber for supporting a drum inside said chamber insulated from said chamber;

a shaft made of an electrically conductive material projecting from a wall of said chamber with a first end portion thereof located inside said chamber and a second end portion located outside said chamber, said drum being electrically connected to and fixedly supported by said first end portion;

means for electrically insulating said shaft from said chamber;

a source of RF power;

a matching unit connecting said source of RF power to said shaft comprising a series connection of a capacitor and a first inductance element such that impedance of said RF power source matches on impedance of said plasma discharge circuit between said drum and said chamber; and a second inductance element connected between said shaft and ground thereby moderating a gradient of electric potential near said drum surface preventing positive ions from bombarding said drum surface, providing a smooth drum surface.

2. The plasma CVD apparatus of claim 1, wherein said shaft is rotatably mounted.

3. The plasma CVD apparatus of claim 1, further comprising a motor connected to said shaft through an electrically insulating unit.

4. The plasma CVD apparatus of claim 1, wherein the inductance of said second inductance element is selected such that the matching condition of said matching unit is not influenced.

* * * * *